United States Patent
Mornet et al.

(10) Patent No.: US 9,103,605 B2
(45) Date of Patent: Aug. 11, 2015

(54) HEAT EXCHANGE DEVICE

(75) Inventors: Eric Mornet, Nogent sur Marne (FR); Christine Roucoules, Deuil-la-Barre (FR)

(73) Assignee: Valeo Vision, Bobigny (FR)

( * ) Notice: Subject to any disclaimer, the term of this patent is extended or adjusted under 35 U.S.C. 154(b) by 844 days.

(21) Appl. No.: 13/167,041

(22) Filed: Jun. 23, 2011

(65) Prior Publication Data

US 2011/0315342 A1  Dec. 29, 2011

(30) Foreign Application Priority Data

Jun. 24, 2010 (FR) ...................... 10 55046

(51) Int. Cl.
| | |
|---|---|
| *B60H 1/00* | (2006.01) |
| *F28F 13/00* | (2006.01) |
| *F21S 8/10* | (2006.01) |
| *F21V 29/00* | (2015.01) |
| *H01L 23/367* | (2006.01) |
| *H01L 23/373* | (2006.01) |
| *F21V 29/74* | (2015.01) |
| *F21Y 101/02* | (2006.01) |

(52) U.S. Cl.
CPC ............. *F28F 13/003* (2013.01); *F21S 48/115* (2013.01); *F21S 48/215* (2013.01); *F21S 48/328* (2013.01); *F21V 29/004* (2013.01); *F21V 29/74* (2015.01); *H01L 23/367* (2013.01); *H01L 23/3733* (2013.01); *F21V 29/006* (2013.01); *F21Y 2101/02* (2013.01); *F28F 2275/10* (2013.01); *H01L 2924/0002* (2013.01); *Y10T 29/4935* (2015.01)

(58) Field of Classification Search
CPC . H01L 23/3733; H01L 23/373; F28F 13/003; F28F 2013/001; F28F 13/078; Y10S 165/907
USPC .................................................... 165/41, 185
See application file for complete search history.

(56) References Cited

U.S. PATENT DOCUMENTS

| | | | | |
|---|---|---|---|---|
| 3,848,666 A | * | 11/1974 | Valdo ............................ | 165/168 |
| 3,973,718 A | * | 8/1976 | Deschamps .................... | 228/183 |
| 4,285,385 A | * | 8/1981 | Hayashi et al. ................... | 164/9 |
| 4,416,264 A | * | 11/1983 | Herrick et al. ................ | 126/674 |
| 4,459,976 A | * | 7/1984 | Speros ......................... | 126/674 |
| 4,600,052 A | * | 7/1986 | Wood et al. ................... | 165/165 |
| 4,719,968 A | * | 1/1988 | Speros ......................... | 165/165 |
| 4,753,849 A | * | 6/1988 | Zohler ......................... | 165/133 |
| 4,896,719 A | * | 1/1990 | O'Neill et al. ................ | 165/120 |
| 4,898,234 A | * | 2/1990 | McGovern et al. ............ | 165/170 |
| 5,123,982 A | * | 6/1992 | Kuzay .......................... | 165/80.1 |
| 5,151,246 A | * | 9/1992 | Baumeister et al. ............. | 419/2 |

(Continued)

FOREIGN PATENT DOCUMENTS

| | | |
|---|---|---|
| DE | 10055454 A1 | 5/2002 |
| DE | 10123456 A1 | 11/2002 |

(Continued)

*Primary Examiner* — Ljiljana Ciric
(74) *Attorney, Agent, or Firm* — Jacox, Meckstroth & Jenkins

(57) ABSTRACT

A heat exchange device for an automotive vehicle. In one embodiment, the heat exchange device has at least one metal foam and a thermal member, in direct contact with the metal foam, enabling heat exchange between the thermal member and the metal foam. The at least one metal foam is assembled together with the thermal member mechanically which causes a local deformation at a joint where the thermal member engages the at least one metal foam.

19 Claims, 5 Drawing Sheets

(56) References Cited

U.S. PATENT DOCUMENTS

| | | | | |
|---|---|---|---|---|
| 5,225,964 | A * | 7/1993 | Nemes | 165/185 |
| 5,321,888 | A * | 6/1994 | Nemes | 165/80.2 |
| 5,323,294 | A * | 6/1994 | Layton et al. | 165/185 |
| 5,673,561 | A * | 10/1997 | Moss | 62/6 |
| 5,847,926 | A * | 12/1998 | Horton et al. | 361/695 |
| 6,257,312 | B1 * | 7/2001 | Doutre et al. | 164/97 |
| 6,339,875 | B1 * | 1/2002 | Larson | 29/841 |
| 6,397,450 | B1 | 6/2002 | Ozmat | |
| 6,411,508 | B1 * | 6/2002 | Kang et al. | 165/185 |
| 6,503,626 | B1 * | 1/2003 | Norley et al. | 165/185 |
| 6,734,363 | B1 * | 5/2004 | Horton et al. | 174/117 F |
| 6,840,307 | B2 * | 1/2005 | Eesley et al. | 165/185 |
| 6,888,720 | B2 * | 5/2005 | Pfister et al. | 361/689 |
| 6,892,798 | B2 * | 5/2005 | Lee et al. | 165/104.12 |
| 6,913,075 | B1 * | 7/2005 | Knowles et al. | 165/185 |
| 6,958,912 | B2 * | 10/2005 | Pokharna et al. | 165/185 |
| 6,959,753 | B1 * | 11/2005 | Weber et al. | 165/10 |
| 6,964,294 | B2 * | 11/2005 | Hendricks et al. | 165/41 |
| 7,044,199 | B2 * | 5/2006 | Thayer et al. | 165/80.4 |
| 7,086,457 | B2 * | 8/2006 | Kienbock et al. | 165/148 |
| 7,131,288 | B2 * | 11/2006 | Toonen et al. | 165/146 |
| 7,144,624 | B2 * | 12/2006 | Knowles et al. | 165/185 |
| 7,331,377 | B1 * | 2/2008 | Toy | 165/80.4 |
| 7,690,419 | B2 * | 4/2010 | Thayer et al. | 165/80.4 |
| 7,718,246 | B2 * | 5/2010 | Strauss | 428/118 |
| 7,762,101 | B1 * | 7/2010 | Zuili et al. | 62/430 |
| 7,871,578 | B2 * | 1/2011 | Schmidt | 422/198 |
| 8,171,986 | B2 * | 5/2012 | Klein | 165/166 |
| 8,453,717 | B1 * | 6/2013 | Roper et al. | 165/80.4 |
| 8,506,242 | B2 * | 8/2013 | Corbeil et al. | 415/116 |
| 8,707,729 | B2 * | 4/2014 | Schmidt et al. | 165/104.26 |
| 2001/0032720 | A1 * | 10/2001 | Eesley et al. | 165/185 |
| 2001/0033956 | A1 * | 10/2001 | Appleby et al. | 165/110 |
| 2002/0100581 | A1 * | 8/2002 | Knowles et al. | 165/185 |
| 2003/0121637 | A1 * | 7/2003 | Lee et al. | 165/10 |
| 2004/0009353 | A1 * | 1/2004 | Knowles et al. | 428/411.1 |
| 2005/0082037 | A1 * | 4/2005 | Thayer et al. | 165/80.4 |
| 2005/0178534 | A1 * | 8/2005 | Kienbock et al. | 165/148 |
| 2006/0137862 | A1 | 6/2006 | Huang et al. | |
| 2006/0245987 | A1 * | 11/2006 | Schmidt | 422/198 |
| 2007/0095652 | A1 * | 5/2007 | Knowles et al. | 204/192.1 |
| 2007/0228113 | A1 * | 10/2007 | Dupree et al. | 228/183 |
| 2008/0044621 | A1 * | 2/2008 | Strauss | 428/108 |
| 2008/0230212 | A1 * | 9/2008 | Crayssac et al. | 165/166 |
| 2009/0038776 | A1 | 2/2009 | Huang | |
| 2009/0190352 | A1 | 7/2009 | Van Tertholen et al. | |
| 2009/0250191 | A1 * | 10/2009 | Klein | 165/44 |
| 2009/0308571 | A1 * | 12/2009 | Thompson et al. | 165/79 |
| 2011/0272122 | A1 * | 11/2011 | Corbeil et al. | 165/133 |
| 2012/0231270 | A1 * | 9/2012 | Dhinojwala et al. | 428/354 |

FOREIGN PATENT DOCUMENTS

| | | |
|---|---|---|
| DE | 102005054508 A1 | 5/2007 |
| EP | 559092 A1 | 9/1993 |
| EP | 2085681 A2 | 8/2009 |
| WO | 2007148280 A1 | 12/2007 |
| WO | 2008119696 A1 | 10/2008 |

* cited by examiner

HEAT EXCHANGE DEVICE

CROSS-REFERENCE TO RELATED APPLICATIONS

This application claims priority to French Application No. 1055046 filed Jun. 24, 2010, which application is incorporated herein by reference and made a part hereof.

STATEMENT REGARDING FEDERALLY SPONSORED RESEARCH

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The invention especially relates to a heat exchange device.

2. Description of the Related Art

A heat exchanger for cooling power electronics modules, using a metal foam, is known from U.S. Pat. No. 6,397,450, which is incorporated herein by reference and made a part hereof. This foam is compressed, prior to its use, so as to obtain a certain alignment of the ligaments so as to promote the flow of air, causing heat exchange, in a particular direction.

A porous structure attached to a carrier by sintering is also known from patent application WO 2008/119696, which is incorporated herein by reference and made a part hereof.

Conventionally, a metal foam may comprise a network of metal ligaments forming many cells that allow air to pass from one cell to another.

These metal foams enable very good convective heat exchange from the foam to a heat-transfer fluid (air by way of non-limiting example) because of the high contact area and the relatively chaotic (non-rectilinear) movement of the air.

For an identical exchange performance in air, the volume of the foam required may be about 30% lower than that used for a finned technology.

The invention aims especially to improve heat exchange between a thermal member and a metal foam.

BRIEF SUMMARY OF THE INVENTION

The invention relates especially to convective heat exchange, for heating or cooling, using a metal foam.

The heat exchange considered in the invention may equally be carried out either by forced convection or by natural convection or by both together. The metal foams considered here are open-cell metal foams, the latter allowing fluid to flow from one cell into the neighboring cells.

One embodiment of the invention is thus a heat exchange device, especially for an automotive vehicle, this device comprising:

at least one metal foam; and
a thermal member, in direct contact with the metal foam, enabling heat exchange between the thermal member (which especially forms a heat or cold source) and the metal foam.

In another embodiment of the invention, a method for assembling a thermal member with a metal foam comprises the step of directly assembling the thermal member with the foam.

In still another embodiment of the invention, a metal foam for mounting on a thermal member to dissipate heat from the thermal member comprises a network of metal ligaments that form open cells, the network of metal ligaments being deformable such that when at least a portion of the metal foam engages the thermal member, the network of metal ligaments deforms to increase an area of contact between the network of metal ligaments and the thermal member.

If need be, the device uses no coolant other than air, which passes through the cells of the foam.

In the present invention the expression "direct contact" is understood to mean, in particular, a contact that does not interpose additional material for the contact between the foam and the thermal member.

Preferably, the metal foam is deformed before or during assembly, especially being locally compressed in the contact regions, at the join with the thermal member. This has the advantage of increasing the area of contact with the thermal member.

Local compression of the foam fibers/ligaments may allow the contact area between the foam and the thermal member to be increased. A greater area makes it possible to limit temperature losses at the interface, because these are proportional to the area.

The present invention may thus be advantageous, from a thermal point of view, relative, for example, to a solution using an adhesive or a solder or braze—such a solution resulting in a thermal interface that is non-optimal because it does not conduct heat efficiently enough and makes only restricted contact with the foam.

Preferably, the thermal member and the metal foam are assembled together, especially forcibly, solely mechanically, especially without soldering, brazing or welding.

A bonding, soldering, brazing or welding solution has the drawback of having an additional processing step and may constrain the style of the finished product and lead to a higher cost.

It is nevertheless possible, if need be, to provide a few local spot welds, by way of non-limiting example using a laser, so as to ensure the mechanical strength of the foam under the stresses that it may experience (thermal shock, stress relaxation etc.).

In this case, the weld is local and no material is added and it takes almost no part in heat transfer because of its small area (less than 10% of the foam/thermal member contact area).

In an exemplary embodiment of the invention, the metal foam is locally deformed, especially locally compressed, at the join with the thermal member.

If it is desired, at least locally, especially in a region far from the join with the thermal member, the cells of the metal foam may be arranged isotropically.

Within this region of the foam, the thermal diffusivity is preferably the same in all directions.

For example, the thermal member and the metal foam are joined together using a attachment by mechanical force.

Advantageously the thermal member is attached to the metal foam by locally deforming this foam, at least in a contact region between the thermal member and the metal foam.

In an exemplary embodiment of the invention, the metal foam comprises at least one insertion passage arranged so as to enable the insertion, especially the insertion by mechanical force, of a portion of the thermal member into this passage.

To carry out the mounting by mechanical force, the area of the insertion passage is mostly or completely contained in the area of the portion of the thermal member inserted into the metal foam.

This passage may for example be produced by cutting and/or piercing the foam.

This insertion passage in the foam may be formed by an orifice, for example a cylindrical orifice. This orifice may or may not be a through-orifice.

As a variant, this passage is formed by a slit, for example having a rectangular cross section.

The cross section of the passage is preferably smaller than that of the portion of the thermal member which is to be inserted therein.

If need be, the foam comprises a plurality of insertion passages, especially placed substantially parallel to one another.

This arrangement has the advantage of making placement during assembly easier.

As a variant, the foam comprises a sole insertion passage.

In an exemplary embodiment of the invention, the thermal member comprises a plurality of portions each of which is inserted into an insertion passage in the foam, this plurality of portions of the thermal member possibly being substantially parallel.

For example, the portion of the thermal member inserted into the insertion passage in the foam comprises a fin or a pin.

One embodiment of the invention may thus enable bonding to be omitted and attachment to be ensured by compressing the foam between two fins of the thermal member.

If need be, the foam is pierced so as to forcibly insert the fins thereinto.

This may require that the foam have a piercing of cross section smaller than that of the fin so as to ensure that the foam makes good contact with the fin.

The invention furthermore greatly reduces fabrication costs.

In addition, the contact between the fins or pins and the foam is increased.

This is because, during compression of the foam, the fibers (or ligaments) of the foam are compressed against the thermal member and the part making contact increases, thereby ensuring better heat conduction from the fins or pins to the fibers of the foam.

If it is desired, the thermal member comprises a rod or a heat pipe and the portion of the thermal member inserted into the insertion passage in the foam corresponds to a portion of this rod or this pipe.

If it is desired, the thermal member comprises a tube, in which a first heat-transfer fluid flows, connected to the heat or cold source. The tube is inserted into the foam which exchanges with a second heat-transfer fluid.

In an exemplary embodiment of the invention, the thermal member comprises a plate portion that advantageously makes contact with an external side of the foam.

If need be, the thermal member comprises a plurality of fins and a portion that takes the form of a plate, each of the fins being connected to this plate-shaped portion, for example by way of a bend.

The thermal member may be assembled with a single metal foam.

As a variant, the thermal member is assembled with at least two metal foams that are distant from one another or in contact with one another and that have identical or different thermal properties.

In an exemplary embodiment of the invention, the insertion passage in the foam initially corresponds, before the insertion of the corresponding portion of the thermal member, to a preformed passage.

As a variant, the insertion passage in the foam is formed concomitantly to the insertion into the foam of the corresponding portion of the thermal member. In this case, this passage is not preformed.

If it is desired, during insertion into the foam of the corresponding portion of the thermal member, this portion causes deformation of the foam and especially compresses the foam neighboring the insertion passage.

The portion of the thermal member inserted into an insertion passage in the foam may for example pass right through the foam.

In an exemplary embodiment of the invention, the thermal member comprises at least two fingers/pins (or fins having one dimension at least five times greater than the other two). These fingers/pins are in contact with the foam and ensure thermal contact. These fingers/pins may be bent in one or more places.

The thermal member may be obtained by one of the following methods: sheet metal stamping, injection molding, extrusion, welded assembly, etc.

In an exemplary embodiment of the invention, insertion passages are not required in the metal foam.

The metal foam is positioned between the fingers/pins. In the case of a rectangular foam, the foam is compressed via its two opposite sides by at least one side of the thermal member on one side, and at least one side of the thermal member on the other side.

In a variant of the invention, at least two fingers/pins positioned in a first plane and at least one finger/pin positioned along a direction substantially parallel to the first plane are used to ensure the contact with the foam.

In another variant, one contact side is produced using a plate which may serve to hold the heat and/or cold source. The other side is produced using fingers/pins, bent at least once, so as to lie substantially parallel to the plate.

In an exemplary application, the fingers pass right through the foam. The parallel alignment is therefore obtained in two operations (before and after insertion of the foam).

In another embodiment, the fingers cover the foam. The parallel alignment is obtained before insertion of the foam. It is possible to bend the fingers again so as to prevent any release of the foam.

In an exemplary embodiment of the invention, the foam and the thermal member may be assembled by contact with the interior of the foam and by contact with the exterior of the foam.

In an exemplary embodiment of the invention, the thermal member bears at least one light source, especially an LED (the thermal member supporting the LED), and especially bears an electrical circuit of the LED.

Preferably, the device is arranged as a lighting and/or signalling device for an automotive vehicle.

Another subject of the invention is a method for assembling a thermal member with a metal foam, the method comprising the following step:

directly assembling the thermal member with the foam, especially without additional material, and without sintering.

The method may comprise the following step:
inserting a portion of the thermal member into an insertion passage in the foam.

Advantageously the metal foam is at least locally compressed during assembly of the thermal member and the metal foam.

BRIEF DESCRIPTION OF THE SEVERAL VIEWS OF THE DRAWING(S)

The invention will be better understood on reading the detailed description that follows of non-limiting embodiments of the invention, and on examining the appended drawings, in which.

DETAILED DESCRIPTION OF THE INVENTION

Figure 1:
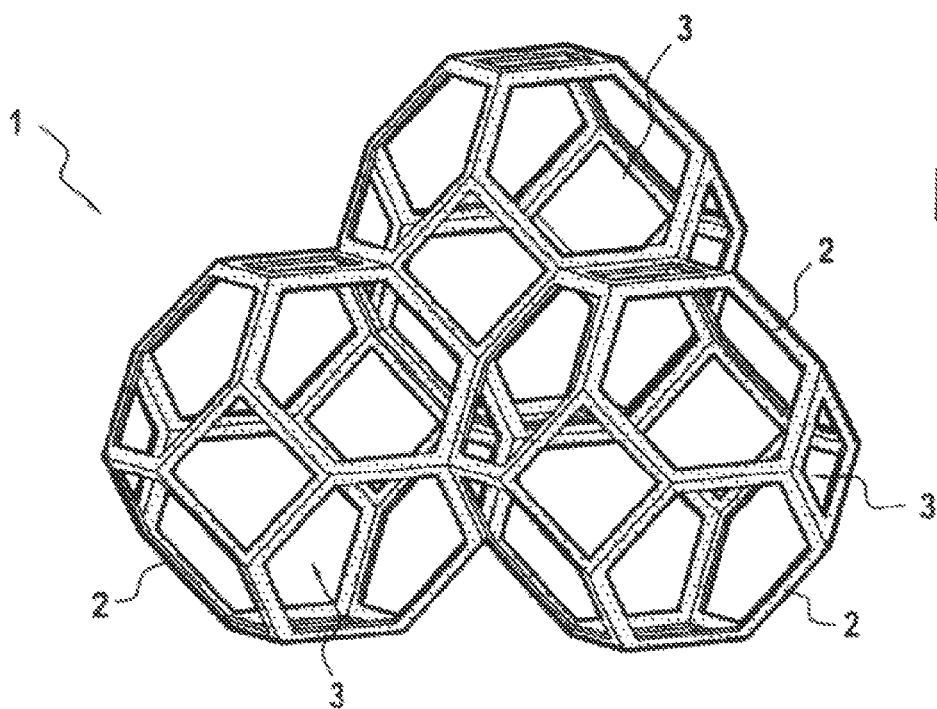
FIG. 1 shows a schematic, partial, perspective view of the unit cells of a metal foam.

Shown in FIG. 1 is a metal foam 1 comprising a network of metal ligaments 2 forming open cells 3 so as to be porous.

Figure 2:
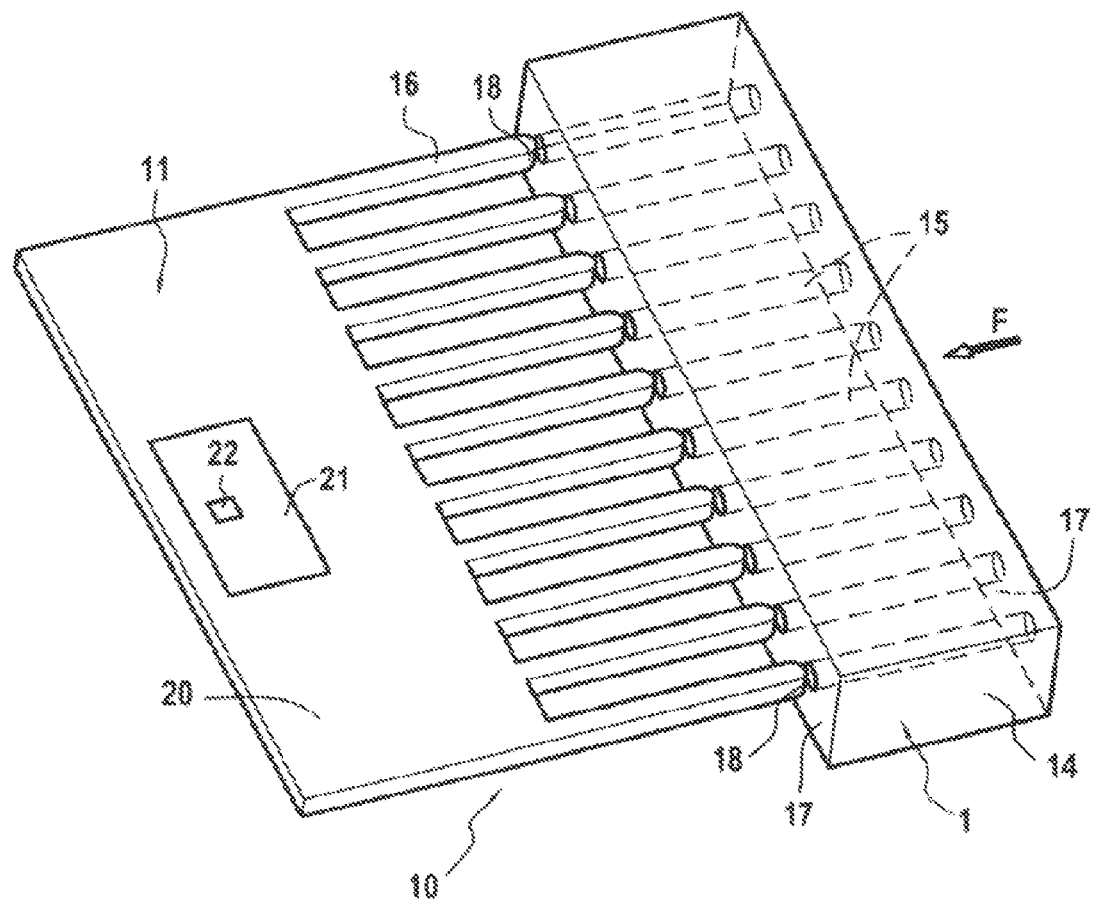
FIG. 2 shows a schematic, partial, perspective view of a heat exchange device according to an exemplary embodiment of the invention, before the thermal member is assembled with the metal foam.

Shown in FIG. 2 is a heat exchange device 10, for an automotive vehicle, this device 10 comprising:
a metal foam 1; and
a thermal member 11 in direct contact with the metal foam 1 enabling heat exchange between the thermal member 11 and the metal foam 1.

In the example shown, the device 10 uses no coolant other than the air (heat-transfer fluid), passing through the cells 3 of the foam 1.

The thermal member 11 and the metal foam 1 are assembled together solely mechanically, especially without soldering, brazing or welding between these elements.

For example, the metal foam 1 is locally deformed at the join 13 with the thermal member 11 (see FIG. 2 for example).

In the example shown, the metal foam 1 contains a region 14 far from the join 13 with the thermal member 11, in which region the cells 3 of the foam 1 are isotropically distributed.

Within this region 14 of the foam, the thermal diffusivity is preferably the same in all directions.

The thermal member 11 is attached to the metal foam 1 by local deformation of this foam, at least in a joining region 13 between the thermal member 11 and the metal foam 1.

In the example described, the metal foam 1 comprises a plurality of insertion passages 15 arranged so that each allows a fin or portion 16 of the thermal member 11 to be forcibly inserted into it.

These passages 15 are for example produced by piercing the foam 1.

Each insertion passage 15 in the foam is a cylindrical orifice, this orifice 15 passing right through the foam so as to open onto two parallel opposed sides 17 of the foam 1. These sides 17 may be planar.

Figure 4:
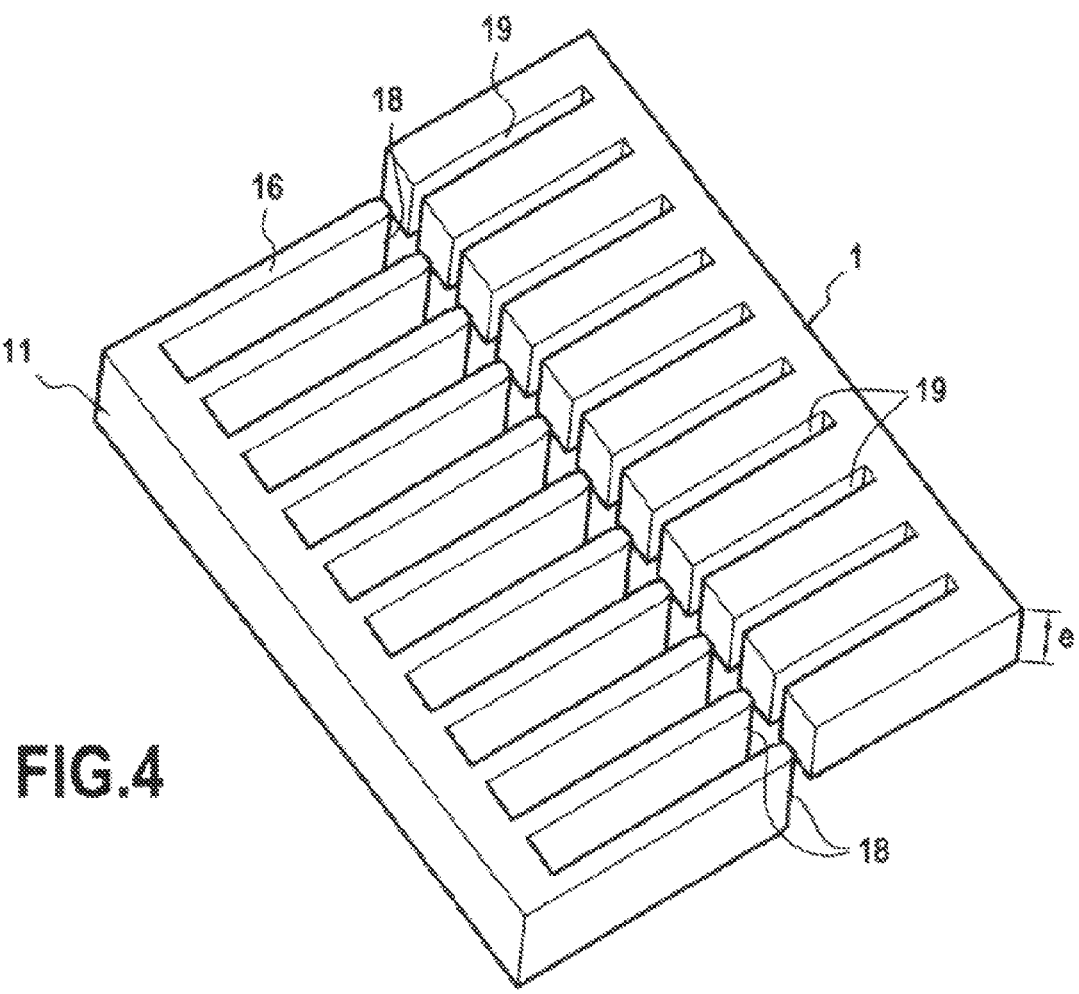
FIG. 4 shows a schematic, partial, perspective view of a heat exchange device according to another exemplary embodiment of the invention, before assembly of the thermal member with the metal foam.

As a variant, as illustrated in FIG. 4, the passages may be formed by slits 19, for example having a rectangular cross section, these slits extending for example through the thickness "e" of the foam 1.

Figure 3:
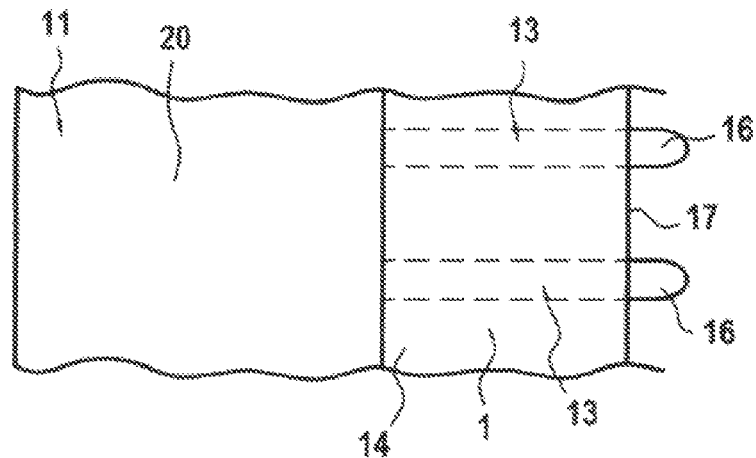
FIG. 3 shows a top view of the device in FIG. 2 after assembly.

In the examples in FIGS. 2 to 4, the portions 16 of the thermal member 11 that are inserted into the insertion passages 15 or 19 in the foam 1 are each formed by a fin 16.

These fins 16 are parallel to one another.

Each fin 16 comprises on its free end a bevel 18 making insertion of this fin 16 into the corresponding orifice 15 easier.

The arrow F (see FIG. 2) shows the insertion direction of the foam 1 onto the thermal member 11.

Each orifice 15 in the foam may have a smaller cross section than that of the fin 16 so as to ensure that the foam 1 makes good contact with the fin 16.

Contact between the fins 16 and the foam 1 is increased.

This is because, during compression of the foam 1, the fibres (or ligaments) of the foam are compressed by the fins 16 and the part making contact increases, thereby ensuring better heat conduction from the fins 16 to the fibres of the foam 1.

Each fin 16 of the thermal member 11 is inserted into the associated insertion passage 15 in the foam and protrudes beyond this passage 15 after insertion (see FIG. 3).

In the example in FIGS. 2 and 3, the thermal member 11 comprises a plate portion 20 bearing an electrical circuit 21 that incorporates an LED 22.

In this example, the plate 20 is located to one side of the foam block 1.

Figure 5:
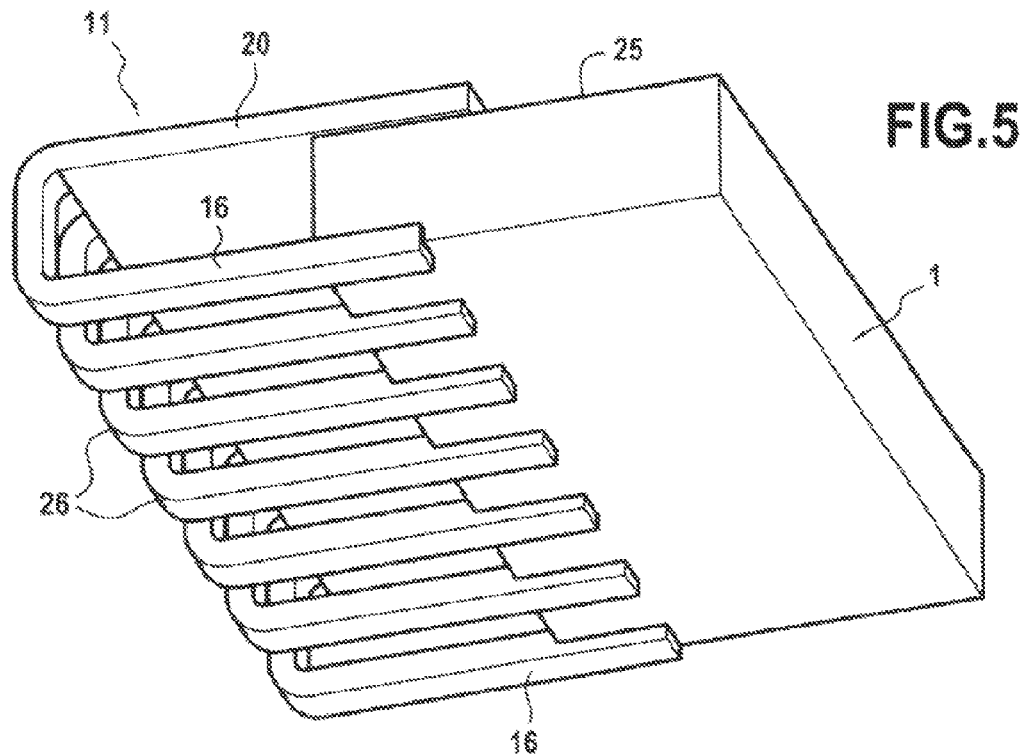
FIGS. 5 and 6 show schematic, partial, perspective views of a heat exchange device according to another exemplary embodiment of the invention, respectively before and after assembly.
Figure 6:
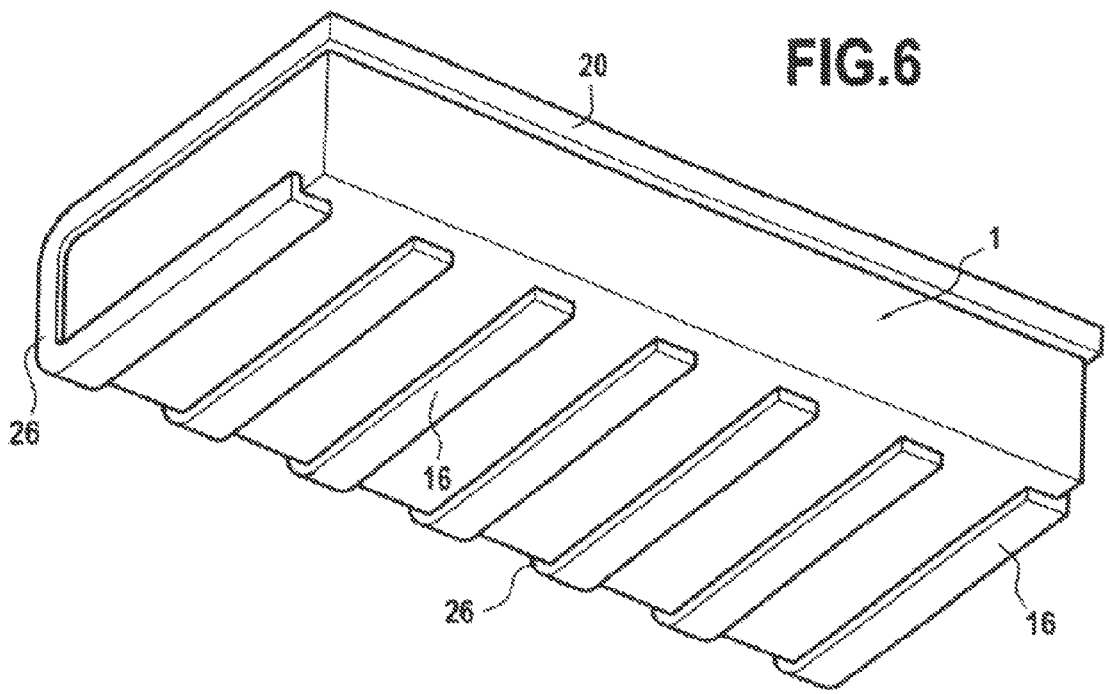

As a variant, as illustrated in FIGS. 5 and 6, the plate 20 of the thermal member 11 is in contact with an external side 25 of the foam 1.

In this example, a plurality of fins 16 are connected to the plate portion 20, each of the fins 16 being connected to this plate portion 20 via a bend 26, especially a U-bend.

The foam 1 is thus imprisoned between the plate portion 20 and the fins 16, as illustrated in FIG. 6.

In the examples described above, the foam 1 has a substantially slab-like shape.

Figure 7:
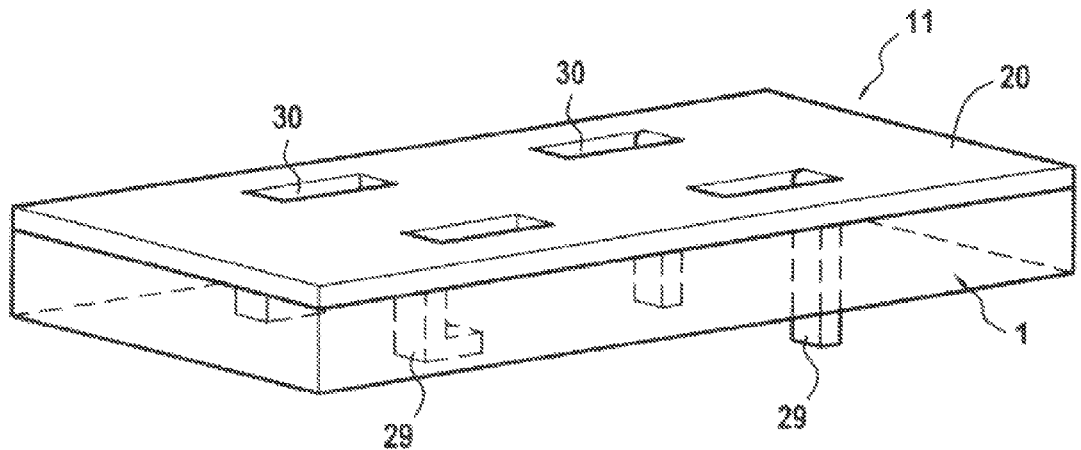
FIGS. 7 to 10 show schematic, partial, perspective views of heat exchange devices according to other exemplary embodiments of the invention.

In another exemplary embodiment of the invention illustrated in FIG. 7, the thermal member 11 comprises a plate portion 20 having tabs 29 produced by cutting and folding this plate portion 20, thus creating holes 30 in the plate portion 20.

Each tab 29 passes through the thickness of the foam 1 and is folded at its free end so as to hold the foam secured to the thermal member 11.

Figure 8:
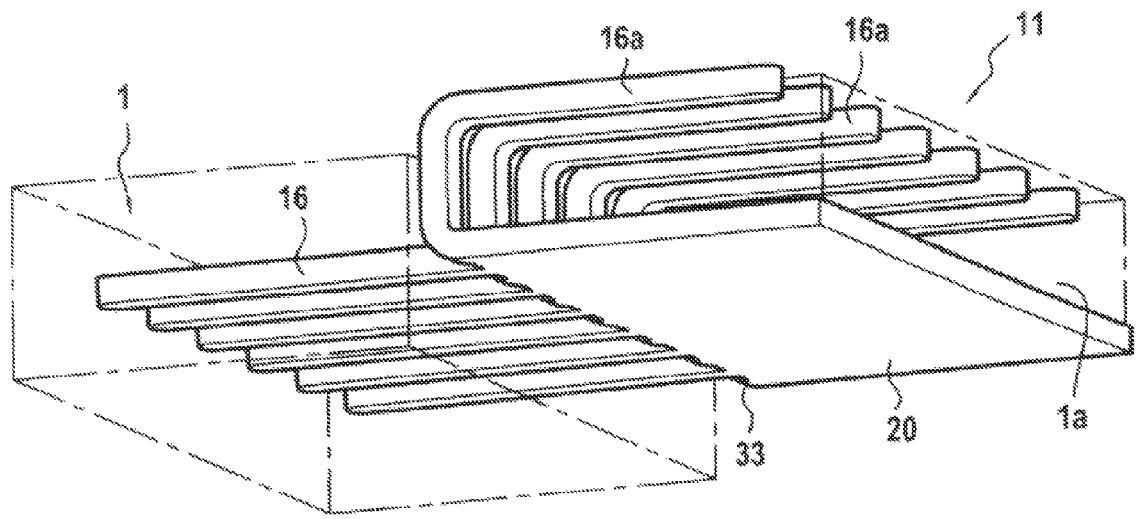

In another exemplary embodiment of the invention illustrated in FIG. 8, the thermal member 11 comprises a plate portion 20 with, alternately, starting from one edge 33, straight fins 16 and bent fins 16a.

The straight fins 16 penetrate into a foam block 1, and the curved fins 16a penetrate into another foam block 1a.

In this example, the device 1 uses two foam blocks.

Figure 9:
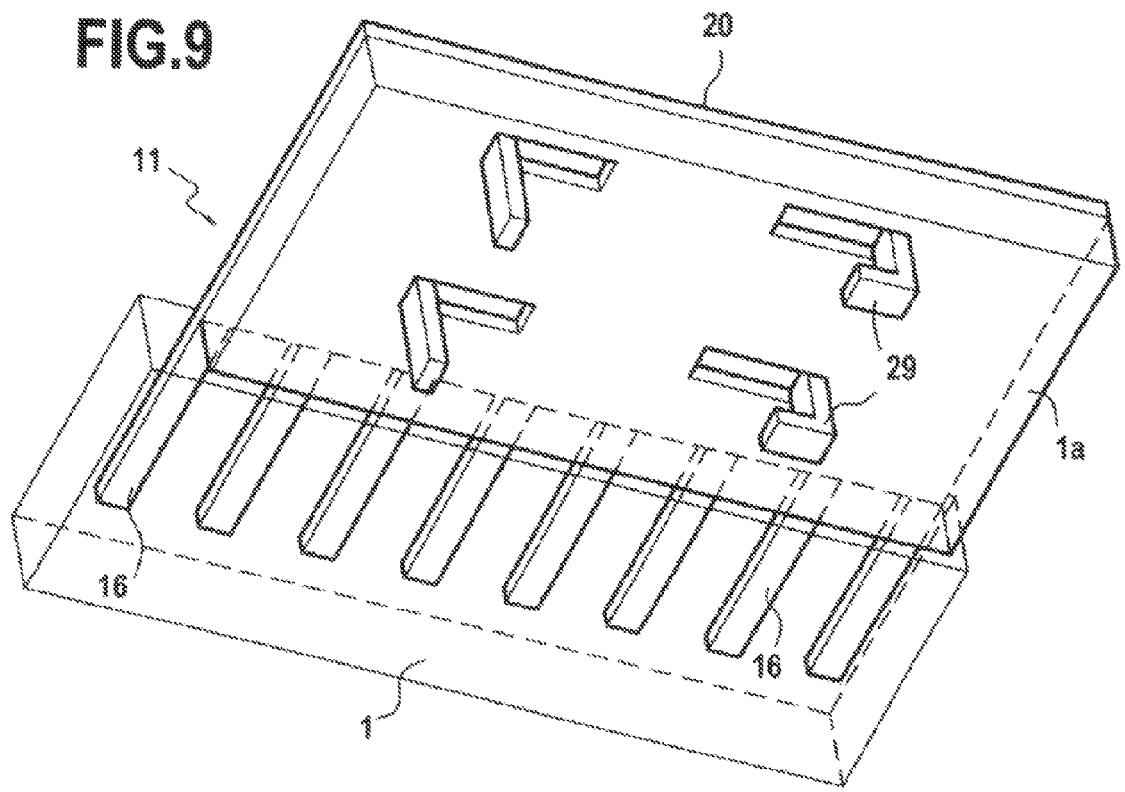

In another exemplary embodiment of the invention, illustrated in FIG. 9, the thermal member 11 comprises a plate portion 20 with both straight fins 16, such as those described with reference to FIG. 2, and tabs 29, such as those described in FIG. 7.

These fins 16 and theses tabs 29 are perpendicular to one another, and are respectively associated with a foam block 1 and 1a.

Figure 10:
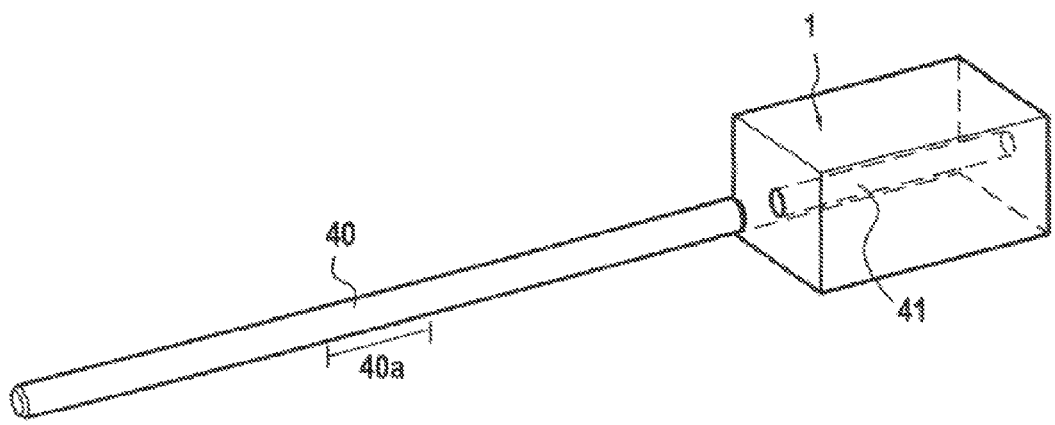

In another exemplary embodiment of the invention illustrated in FIG. 10, the thermal member 11 comprises a rod or a heat pipe 40 and the portion of the thermal member that is inserted in the (cylindrical) insertion passage 41 in the foam 1 corresponds to a portion 40a of this rod or this pipe.

The device 10 is arranged as a lighting and/or signalling device for an automotive vehicle, for example a headlamp for producing a high beam and/or a low beam.

In insertion by mechanical force applications, it may be necessary to ensure that the metal foam remains secured to the metal member.

The benefit may be that the introduction of play over time, the production of dust and the loss of the contact function over time are prevented.

This may be obtained by blocking the ends for example, by folding a part of the metal member, or by local pinching of one end of the foam that does not take part in the cooling.

Another solution could be to produce local spot welds having the sole function of providing mechanical fastening.

Finally, a last solution could be to add an additional element such as one or more screws, for holding the metallic member and the foam firmly in place.\

While the system, apparatus and method herein described constitute preferred embodiments of this invention, it is to be understood that the invention is not limited to this precise system, apparatus and method, and that changes may be made therein without departing from the scope of the invention which is defined in the appended claims.

What is claimed is:

1. A heat exchange device for an automotive vehicle, said heat exchange device comprising:
    at least one metal foam; and
    a thermal member, in direct contact with said at least one metal foam, enabling heat exchange between said thermal member and said at least one metal foam;
    wherein said at least one metal foam is locally deformed by said thermal member where thermal member engages said at least one metal foam;
    wherein said thermal member bears at least one light source, said at least one light source comprising an LED.

2. The heat exchange device according to claim 1, wherein said thermal member and said at least one metal foam are assembled together without soldering, brazing or welding and by applying a mechanical force that causes a local deformation in the at least one metal foam at a joint where said thermal member engages said at least one metal.

3. The heat exchange device according to claim 2, wherein said at least one metal foam is locally deformed at said joint with said thermal member.

4. The heat exchange device according to claim 3, wherein said thermal member comprises a plurality of portions each of which is inserted into an insertion passage in said at least one metal foam.

5. The heat exchange device according to claim 4, wherein said plurality of portions of said thermal member are parallel.

6. The heat exchange device according to claim 3, wherein said thermal member bears at least one light source, wherein said at least one light source comprises an LED.

7. The heat exchange device according to claim 3, wherein said heat exchange device is arranged as a lighting and/or signalling device for an automotive vehicle.

8. The heat exchange device according to claim 1, wherein said at least one metal foam is locally deformed at a joint with said thermal member.

9. The heat exchange device according to claim 8, wherein said thermal member and said at least one metal foam are caused to be joined together using a mechanical force.

10. The heat exchange device according to claim 1, wherein said thermal member and said at least one metal foam are caused to be joined together by using a mechanical force.

11. The heat exchange device according to claim 1, wherein said at least one metal foam comprises at least one insertion passage arranged so as to enable the insertion by mechanical force of a portion of said thermal member into said at least one insertion passage.

12. The heat exchange device according claim 1, wherein said thermal member comprises a plurality of portions each of which is inserted into an insertion passage in said at least one metal foam.

13. The heat exchange device according to claim 12, wherein said portion of said thermal member inserted into said insertion passage in said at least one metal foam comprises a fin or a pin.

14. The heat exchange device according to claim 12, wherein said plurality of portions of said thermal member are parallel.

15. The heat exchange device according to claim 1, wherein said thermal member comprises a rod or a heat pipe and a portion of said thermal member inserted into an insertion passage in said at least one metal foam corresponds to a portion of said rod or said heat pipe.

16. The heat exchange device according to claim 1, wherein said heat exchange device is arranged as a lighting and/or signalling device for an automotive vehicle.

17. The heat exchange device according to claim 1, wherein said at least one metal foam comprises:
    a network of metal ligaments that form open cells;
    said network of metal ligaments being deformable such that when at least a portion of said at least one metal foam engages said thermal member, said network of metal ligaments deforms to increase an area of contact between said network of metal ligaments and said thermal member.

18. The heat exchange device according to claim 1, wherein said at least one metal foam comprises at least one insertion passage arranged so as to enable the insertion by mechanical force of a portion of said thermal member into said at least one insertion passage.

19. The heat exchange device according to claim 1, wherein a portion of said thermal member inserted into an insertion passage in said at least one metal foam comprises a fin or a pin.

* * * * *

UNITED STATES PATENT AND TRADEMARK OFFICE
CERTIFICATE OF CORRECTION

| | | |
|---|---|---|
| PATENT NO. | : 9,103,605 B2 | Page 1 of 1 |
| APPLICATION NO. | : 13/167041 | |
| DATED | : August 11, 2015 | |
| INVENTOR(S) | : Eric Mornet et al. | |

It is certified that error appears in the above-identified patent and that said Letters Patent is hereby corrected as shown below:

On The Title Page, Item (75) Inventors: delete "Nogent sur Mame" and insert -- Nogent sur Marne -- therefore.

In the Claims

Claim 2, column 7, line 46, insert --foam-- after metal.

Signed and Sealed this
Fifteenth Day of December, 2015

Michelle K. Lee
*Director of the United States Patent and Trademark Office*